(12) United States Patent
Kusano et al.

(10) Patent No.: US 10,379,165 B2
(45) Date of Patent: Aug. 13, 2019

(54) BATTERY CHARACTERISTICS LEARNING APPARATUS

(71) Applicant: DENSO CORPORATION, Kariya, Aichi-pref. (JP)

(72) Inventors: Yoshikazu Kusano, Aichi-ken (JP); Hisashi Umemoto, Tokai (JP); Naomi Awano, Nagoya (JP); Manabu Yamada, Okazaki (JP)

(73) Assignee: DENSO CORPORATION, Kariya (JP)

( * ) Notice: Subject to any disclaimer, the term of this patent is extended or adjusted under 35 U.S.C. 154(b) by 1133 days.

(21) Appl. No.: 14/534,259

(22) Filed: Nov. 6, 2014

(65) Prior Publication Data
US 2015/0127281 A1  May 7, 2015

(30) Foreign Application Priority Data

Nov. 7, 2013  (JP) .................................. 2013-231115

(51) Int. Cl.
*G06F 19/00* (2018.01)
*G01R 31/36* (2019.01)
(Continued)

(52) U.S. Cl.
CPC ....... *G01R 31/3648* (2013.01); *G01R 31/367* (2019.01); *G01R 31/382* (2019.01); *G06N 20/00* (2019.01)

(58) Field of Classification Search
CPC .... G01R 31/3606; H02J 7/0026; H02J 7/0063
(Continued)

(56) References Cited

U.S. PATENT DOCUMENTS 4,697,134 A * 9/1987 Burkum ............. G01R 31/3658
320/116
5,606,242 A * 2/1997 Hull ....................... H02J 7/0004
320/106
(Continued)

FOREIGN PATENT DOCUMENTS

JP   2005-083970   3/2005
JP   2010-135075   6/2010
(Continued)

OTHER PUBLICATIONS

Office Action (2 pages) dated Sep. 15, 2015, issued in corresponding Japanese Application No. 2013-231115 and English translation (3 pages).

*Primary Examiner* — Edward Raymond
(74) *Attorney, Agent, or Firm* — Nixon & Vanderhye P.C.

(57) ABSTRACT

A battery characteristics learning apparatus is provided for calculating learning values of circuit constants of an equivalent circuit of a rechargeable battery. The apparatus includes: (1) means for acquiring values of terminal voltage of the battery sensed by voltage-sensing means and values of current of the battery sensed by current-sensing means and storing the acquired values in time series; (2) means for determining, based on the acquired values of the current, whether there has occurred a predetermined change in the current; and (3) means for calculating, when it is determined that the predetermined change has occurred, the learning values of the circuit constants based on those values of the terminal voltage and the current which are acquired at sampling time points or during sampling periods, each of the sampling time points and the sampling periods being set according to a corresponding one of time constants defined by the circuit constants.

10 Claims, 4 Drawing Sheets

(51) Int. Cl.
*G01R 31/367* (2019.01)
*G06N 20/00* (2019.01)
*G01R 31/382* (2019.01)

(58) Field of Classification Search
USPC ..................................... 702/63–66, 182–185
See application file for complete search history.

(56) References Cited

U.S. PATENT DOCUMENTS

| | | | |
|---|---|---|---|
| 7,173,397 B2* | 2/2007 | Kinoshita | B60L 11/1851 320/134 |
| 2013/0154577 A1 | 6/2013 | Iwane et al. | |
| 2015/0084639 A1* | 3/2015 | Joe | G01R 31/3651 324/428 |
| 2015/0226809 A1* | 8/2015 | Joe | G01R 31/3606 324/426 |
| 2015/0285869 A1* | 10/2015 | Wada | H01M 10/48 702/63 |
| 2015/0380957 A1* | 12/2015 | Ghantous | H02J 7/0052 320/134 |

FOREIGN PATENT DOCUMENTS

| | | |
|---|---|---|
| JP | 2011-047820 | 3/2011 |
| JP | 2012-132724 | 7/2012 |

* cited by examiner

BATTERY CHARACTERISTICS LEARNING APPARATUS

CROSS-REFERENCE TO RELATED APPLICATION

This application is based on and claims priority from Japanese Patent Application No. 2013-231115 filed on Nov. 7, 2013, the content of which is hereby incorporated by reference in its entirety into this application.

BACKGROUND

1 Technical Field

The present invention relates to a battery characteristics learning apparatus that learns circuit constants of an equivalent circuit of a rechargeable battery (or secondary battery).

2 Description of Related Art

There has been known a method of calculating the internal resistance of a rechargeable battery and diagnosing the operating life (or service life) of the rechargeable battery based on the calculated internal resistance. Moreover, there also has been known a method of calculating the OCV (Open Circuit Voltage) of a rechargeable battery based on the internal resistance of the rechargeable battery, the terminal voltage of the rechargeable battery (or the voltage across the two terminals of the rechargeable battery) and the current flowing through the rechargeable battery and estimating the SOC (State of Charge) of the rechargeable battery based on the calculated OCV.

An equivalent circuit of a rechargeable battery is comprised of a perfect voltage source and circuit constants (i.e., ohmic resistance components and capacitance components) representing the internal resistance of the rechargeable battery. To calculate the internal resistance of the rechargeable battery in a transient response state where the current flowing through the rechargeable battery changes, it is necessary to first calculate the circuit constants of the equivalent circuit of the rechargeable battery. Further, there has been known, for example from Japanese Patent Application Publication No. JP2011047820A, a method of sensing both the terminal voltage of the rechargeable battery and the current flowing through the rechargeable battery for a predetermined time period and calculating the circuit constants based on values of the sensed terminal voltage and current.

Specifically, according to the method disclosed in the above patent document, the present values of the circuit constants R1 and C1 are calculated based on a regression line; the regression line is determined, on a two-dimensional coordinate plane (C1R1, R1) whose center point is represented by the previous values of C1R1 and R1, using a plurality of points in proximity to the center point.

Moreover, the circuit constants of an equivalent circuit of a rechargeable battery define a plurality of time constants that are different from each other. However, according to the method disclosed in the above patent document, the circuit constants are calculated based on the values of the sensed terminal voltage and current which are acquired without considering the time constants defined by the circuit constants. In other words, the time constants are not taken into account in the calculation of the circuit constants. Consequently, when the values of the sensed terminal voltage and current are acquired immediately after a change in the current flowing through the rechargeable battery, those circuit constants which define a large time constant cannot be accurately calculated whereas those circuit constants which define a small time constant can be accurately calculated. In contrast, when the values of the sensed terminal voltage and current are acquired after a long time from a change in the current flowing through the rechargeable battery, those circuit constants which define a small time constant cannot be accurately calculated whereas those circuit constants which define a large time constant can be accurately calculated. That is, in either case, it is impossible to accurately calculate all the circuit constants of the equivalent circuit of the rechargeable battery.

SUMMARY

According to exemplary embodiments, there is provided a battery characteristics learning apparatus for calculating learning values of a plurality of circuit constants of an equivalent circuit of a rechargeable battery. The plurality of circuit constants define a plurality of time constants that are different each other. The battery characteristics learning apparatus includes: (1) means for acquiring values of terminal voltage of the rechargeable battery which is sensed by voltage-sensing means and values of current flowing through the rechargeable battery which is sensed by current-sensing means and storing the acquired values of the terminal voltage and the current in time series; (2) means for determining, based on the values of the current acquired by the acquiring means, whether there has occurred a predetermined change in the current flowing through the rechargeable battery; and (3) means for calculating, when it is determined by the determining means that the predetermined change has occurred, the learning values of the circuit constants based on those values of the terminal voltage and the current which are acquired by the acquiring means at a plurality of sampling time points or during a plurality of sampling periods, each of the sampling time points being set to a time point that is distant from an initial time point, at which the predetermined change in the current starts, by a length of time equal to a corresponding one of the time constants, each of the sampling periods being set so as to include a time point that is distant from the initial time point by a length of time equal to a corresponding one of the time constants.

With the above configuration, it is possible to reliably determine, based on the values of the current acquired and stored in time series, whether there has occurred the predetermined change in the current which is suitable for calculation of the learning values of the circuit constant. Further, when the predetermined change has occurred, it is possible to accurately calculate the learning values of the circuit constants based on those values of the terminal voltage and the current which are acquired at the sampling time points or during the sampling periods; each of the sampling time points and the sampling periods is set or specified according to the corresponding time instant. That is, for each of the circuit constants, it is possible to accurately calculate the learning value of the circuit constant based on those values of the terminal voltage and the current which are suitable for the circuit constant.

It is preferable that the determining means determines that the predetermined change has occurred in the current flowing through the rechargeable battery when the current has increased or decreased after being kept at a constant value for a time period not shorter than a predetermined time.

It is further preferable that the determining means determines that the predetermined change has occurred in the current flowing through the rechargeable battery when the rechargeable battery is brought into a steady state after the increase or decrease of the current. In the steady state, both the current flowing through the rechargeable battery and the terminal voltage of the rechargeable battery are constant.

Preferably, the battery characteristics learning apparatus further includes means for determining whether the rechargeable battery is in a charge state or in a discharge state based on the values of the current sensed by the current-sensing means. When the rechargeable battery is determined by the battery state determining means as being in the charge state, the calculating means calculates the learning values of the circuit constants in the charge state. Otherwise, when the rechargeable battery is determined by the battery state determining means as being in the discharge state, the calculating means calculates the learning values of the circuit constants in the discharge state.

Preferably, the battery characteristics learning apparatus further includes: means for calculating the SOC of the rechargeable battery; and means for correcting at least one of the learning values of the circuit constants, which is calculated by the learning values calculating means, according to the SOC of the rechargeable battery at the sampling time point or in the sampling period where the values of the terminal voltage and the current used for the calculation of the at least one of the learning values are acquired by the acquiring means.

BRIEF DESCRIPTION OF THE DRAWINGS

The present invention will be understood more fully from the detailed description given hereinafter and from the accompanying drawings of exemplary embodiments, which, however, should not be taken to limit the invention to the specific embodiments but are for the purpose of explanation and understanding only.

In the accompanying drawings.

DESCRIPTION OF EMBODIMENTS

Exemplary embodiments will be described hereinafter with reference to FIGS. 1-7. It should be noted that for the sake of clarity and understanding, identical components having identical functions throughout the whole description have been marked, where possible, with the same reference numerals in each of the figures and that for the sake of avoiding redundancy, descriptions of the identical components will not be repeated.

[First Embodiment]

Figure 1:
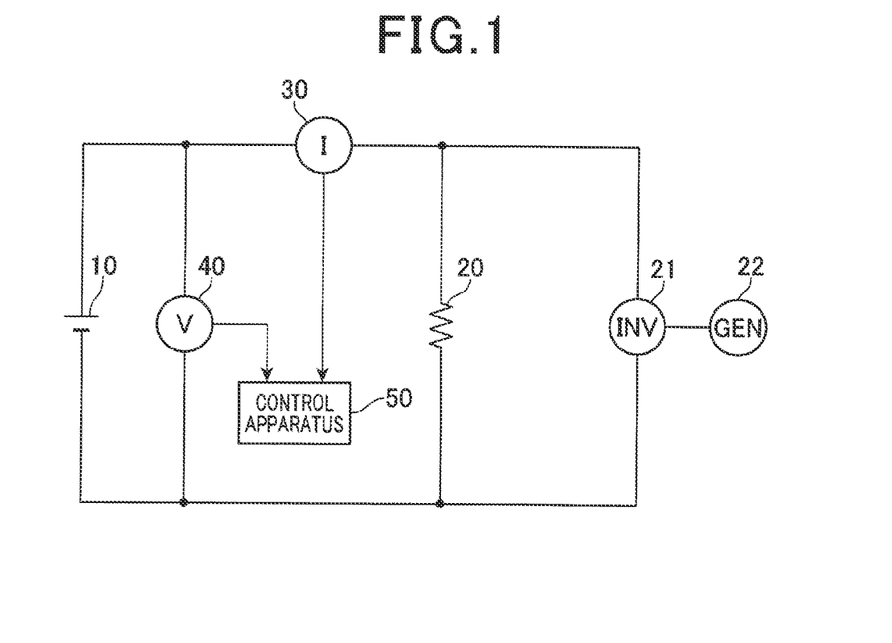
FIG. 1 is a schematic circuit diagram illustrating an electric circuit which includes a rechargeable battery and a battery characteristics learning apparatus according to a first embodiment.

FIG. 1 shows an electric circuit which includes a rechargeable battery (or secondary battery) 10 and a battery characteristics learning apparatus according to the first embodiment.

In the present embodiment, the battery characteristics learning apparatus is configured as a control apparatus 50. Both the rechargeable battery 10 and the control apparatus 50 are used in a motor vehicle. In addition, the rechargeable battery 10 is implemented by, for example, a lithium-ion battery.

As shown in FIG. 1, the rechargeable battery 10 is electrically connected to electric load 20 to supply electric power to the electric load 20. Moreover, the rechargeable battery 10 is also electrically connected to an electric generator 22 (denoted by GEN in FIG. 1) via an inverter 21 (denoted by INV in FIG. 1) that performs electric power conversion between AC (alternating current) and DC (direct current). Consequently, the rechargeable battery 10 can be charged with electric power that is generated by the electric generator 22 and converted from AC into DC by the inverter 21.

In the electric path connecting the rechargeable battery 10 to both the electric load 20 and the inverter 21, there is arranged a current sensor 30 for sensing current I of the rechargeable battery 10 (or current I flowing through the rechargeable battery 10). Moreover, across the terminals of the rechargeable battery 10, there is connected a voltage sensor 40 for sensing the terminal voltage V of the rechargeable battery 10 (or the voltage V across the two terminals of the rechargeable battery 10). The current sensor 30 outputs a current-sensing signal indicative of the sensed current I of the rechargeable battery 10 to the control apparatus 50. Similarly, the voltage sensor 40 outputs a voltage-sensing signal indicative of the sensed terminal voltage V of the rechargeable battery 10 to the control apparatus 50. The control apparatus 50 acquires (or retrieves) values of the sensed current I from the current-sensing signal and values of the sensed terminal voltage V from the voltage-sensing signal. Then, the control apparatus 50 learns the characteristics of the rechargeable battery 10 based on the acquired values of the sensed current I and terminal voltage V.

Figure 2:
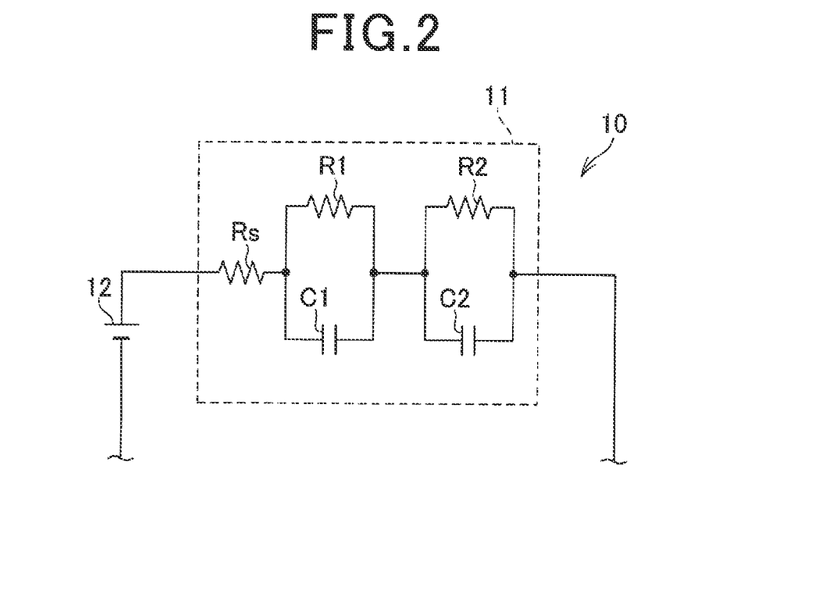
FIG. 2 is a schematic circuit diagram illustrating an equivalent circuit of the rechargeable battery.

FIG. 2 shows an equivalent circuit of the rechargeable battery 10. As shown in the figure, the equivalent circuit is comprised of an internal resistance 11 and a perfect voltage source 12.

The output voltage of the perfect voltage source 12 is equal to the terminal voltage V of the rechargeable battery 10 in a steady state where no current flows through the rechargeable battery 10, i.e., equal to the open circuit voltage of the rechargeable battery 10.

The internal resistance 11 is formed by serially connecting a DC resistance (or ohmic resistance) Rs, a first reaction resistance (R1, C1) that represents the reaction resistance at the positive and negative electrodes of the rechargeable battery 10, and a second reaction resistance (R2, C2) that represents the reaction resistance caused by diffusion of lithium ions in the electrolytic solution or active material of the rechargeable battery 10 and is different from the first reaction resistance (R1, C1). In other words, the internal resistance 11 is comprised of three groups of circuit constants. The first group consists of the single circuit constant Rs. The second group consists of the pair of circuit constants R2 and C2. The third group consists of the pair of circuit constants R3 and C3. The first to the third groups are connected in series with each other.

The value Rt of the internal resistance 11 of the rechargeable battery 10 can be calculated based on the circuit constants Rs, R1 and R2, the time constant $\tau 1$ of the first reaction resistance and the time constant $\tau 2$ of the second reaction resistance.

Specifically, when the sensed current I of the rechargeable battery 10 changes from an initial constant value I0 (e.g., 0A) to another constant value I1 (e.g., 10A), the value Rt of the internal resistance 11 after time t from the start of the change in the sensed current I can be calculated by the following equation:

$$Rt=Rs+R1(1-\exp(-t/\tau 1))+R2(1-\exp(-t/\tau 2)) \quad (1)$$

Moreover, $\tau 1=R1 \cdot C1$; $\tau 2=R2 \cdot C2$. Further, $\tau 1$ is, for example, about 0.01s; $\tau 2$ is, for example, about 10 s. In addition, the DC resistance Rs has no capacitance component; thus the time constant TS of the DC resistance Rs is equal to 0 s.

With the change in the current I flowing through the internal resistance 11, a voltage drop Vt occurs across the internal resistance 11. The value Vt (t) of the voltage drop Vt at a time point t can be determined by the following equation:

$$\begin{aligned} Vt(t) &= \Delta I \cdot Rt \\ &= \Delta I(Rs+R1(1-\exp(-t/\tau 1))+R2(1-\exp(-t/\tau 2))) \\ &= Vs+V1(1-\exp(-t/\tau 1))+V2(1-\exp(-t/\tau 2)) \end{aligned} \quad (2)$$

where $\Delta I$ is equal to (I1-I0), Vs represents the voltage drop caused by the DC resistance Rs (i.e., $Vs=\Delta I \cdot Rs$), V1 represents the voltage drop caused by the first reaction resistance in a steady state (i.e., $V1=\Delta I \cdot R1$), and V2 represents the voltage drop caused by the second reaction resistance in a steady state (i.e., $V2=\Delta I \cdot R2$).

Figure 3:
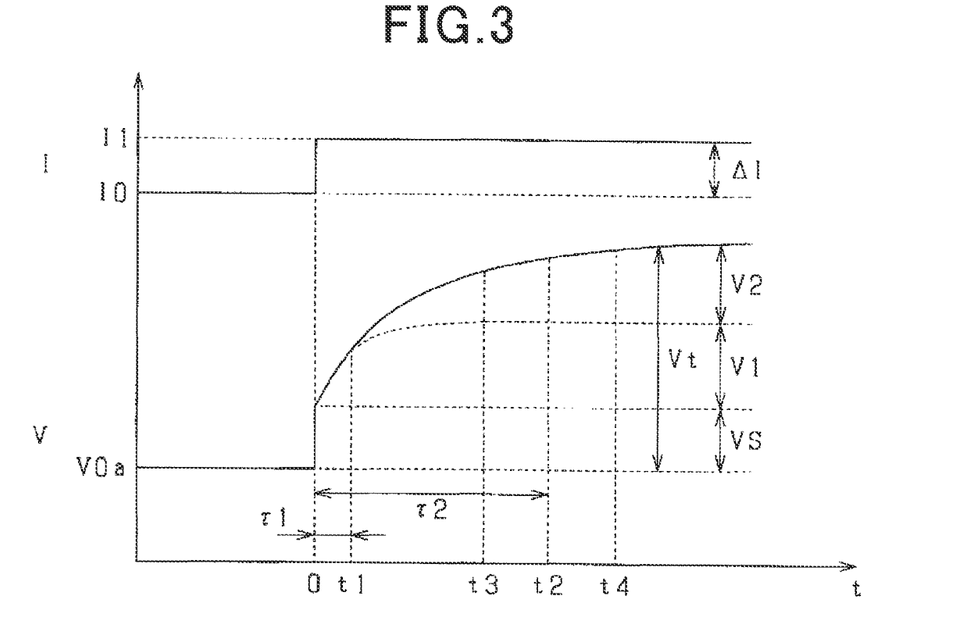
FIG. 3 is a graphical representation illustrating change in the terminal voltage of the rechargeable battery with time.

FIG. 3 shows the change in the sensed terminal voltage V(t) of the rechargeable battery 10 with time when the sensed current I(t) of the rechargeable battery 10 increases from I0 to I1.

The voltage drop Vt(t) across the internal resistance 11 of the rechargeable battery 10 can be calculated as the amount of change of the sensed terminal voltage V(t) of the rechargeable battery 10 with respect to the initial value V0a of the sensed terminal voltage V(t) at the initial time point (t=0) before the change in the sensed current I of the rechargeable battery 10 occurs (i.e., Vt(t)=V(t)−V0a).

When the sensed current I(t) of the rechargeable battery 10 increases from I0 to I1, as shown in FIG. 3, it is possible to calculate the learning values of the circuit constants (Rs, R1, C1, R2, C2) of the equivalent circuit of the rechargeable battery 10 based on the voltage drop Vt(t) across the internal resistance 11 of the rechargeable battery 10. Hereinafter, a method of calculating the learning values of the circuit constants (Rs, R1, C1, R2, C2) according to the present embodiment will be described.

First, among the circuit constants Rs, R1, C1, R2 and C2, the learning values of Rs, R1 and C1 are calculated.

Specifically, in the proximity of a time point t1 which is distant from the initial time point (t=0) by $\tau 1$, $t \ll \tau 2$. Therefore, in the proximity of the time point t1, Equation (2) can be approximated to the following equation:

$$Vt(t)=Vs+V1(1-\exp(-t/\tau 1)) \quad (3)$$

Moreover, the time period (0-t1) from the initial time point (t=0) through the time point t1 is defined as a first sampling period. Further, the values of the voltage drop Vt(t) at a plurality of time points in the first sampling period are respectively calculated based on the values of the sensed terminal voltage V(t) acquired at the time points. Then, Vs and V1 are determined by substituting the calculated values of the voltage drop Vt(t) into Equation (3) (or fitting Equation (3) to the calculated values of the voltage drop Vt(t)).

Thereafter, the learning value of the circuit constant Rs (i.e., the DC resistance Rs) is calculated by the following equation: $Rs=Vs/\Delta I$. The learning value of the circuit constant R1 (i.e., the ohmic resistance component R1 of the first reaction resistance) is calculated by the following equation: $R1=V1/\Delta I$. Further, the learning value of the circuit constant C1 (i.e., the capacitance component C1 of the first reaction resistance) is calculated by the following equation: $C1=\tau 1/R1$.

Next, the learning values of the remaining circuit constants R2 and C2 are calculated.

Specifically, in the proximity of a time point t2 which is distant from the initial time point (t=0) by $\tau 2$, $t \gg \tau 1$. Therefore, in the proximity of the time point t2, Equation (2) can be approximated to the following equation:

$$Vt(t)=Vs+V1+V2(1-\exp(-t/\tau 2)) \quad (4)$$

Moreover, a time period (t3-t4) around the time point t2 is defined as a second sampling period. Here, t3 is set to, for example, $\tau 2/2$ (i.e., $t3=\tau 2/2$); t4 is set to, for example, $3 \cdot \tau 2/2$ (i.e., $t4=3 \cdot \tau 2/2$). Further, the values of the voltage drop Vt(t) at a plurality of time points in the second sampling period are respectively calculated based on the values of the sensed terminal voltage V(t) acquired at the time points. Then, V2 is determined by substituting the calculated values of the voltage drop Vt(t) into Equation (4) (or fitting Equation (4) to the calculated values of the voltage drop Vt(t)).

Thereafter, the learning value of the circuit constant R2 (i.e., the ohmic resistance component R2 of the second reaction resistance) is calculated by the following equation: $R2=V2/\Delta I$. Further, the learning value of the circuit constant C2 (i.e., the capacitance component C2 of the second reaction resistance) is calculated by the following equation: $C2=\tau 2/R2$.

In addition, the fitting of Equations (3) and (4) to the calculated values of the voltage drop Vt(t) can be made by using a nonlinear least-squares method, such as a differential correction method.

Figure 5:
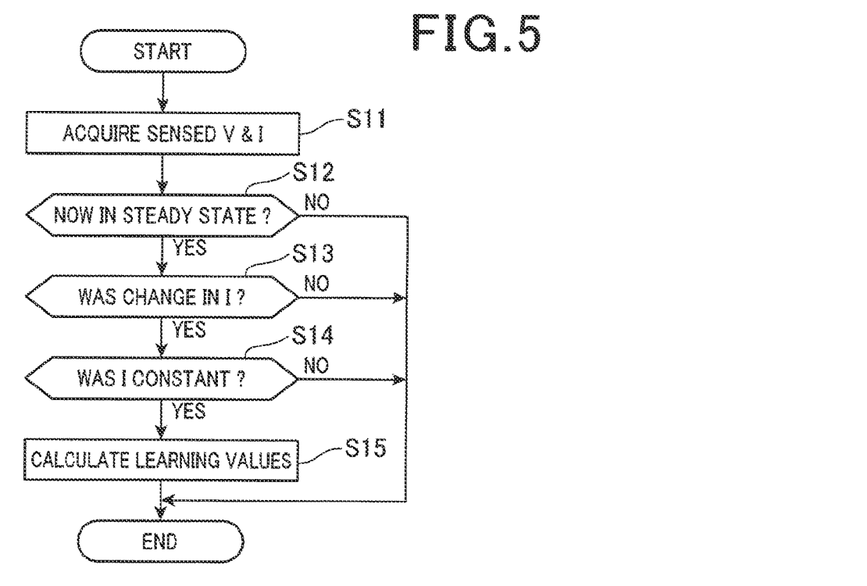
FIG. 5 is a flow chart illustrating a process, according to the first embodiment, of the battery characteristics learning apparatus for calculating the learning values of circuit constants of the equivalent circuit of the rechargeable battery.

FIG. 5 shows a process of calculating the learning values of the circuit constants according to the present embodiment. This process is repeatedly performed by the control apparatus 50 in a predetermined cycle.

First, at step S11, the control apparatus 50 acquires values of the terminal voltage V of the rechargeable battery 10 sensed by the voltage sensor 40 and values of the current I of the rechargeable battery 10 sensed by the current sensor 30. Then, the control apparatus 50 stores the acquired values of the sensed terminal voltage V and current I therein (more specifically, in a memory of the control apparatus 50 which is not shown in the figures) in time series.

Next, at steps S12-S14, the control apparatus 50 determines whether a predetermined learning condition is satisfied.

Specifically, at step S12, the control apparatus 50 determines, based on the values of the sensed terminal voltage V and current I acquired and stored in time series at step S11, whether the rechargeable battery 10 is now in a steady state.

If the determination at step S12 results in a "NO" answer, then the process directly goes to the end. In contrast, if the determination at step S12 results in a "YES" answer, then the process proceeds to step S13.

At step S13, the control apparatus 50 further determines, based on the values of the sensed current I acquired in the past, whether there was a change in the current I of the rechargeable battery 10 immediately before the present steady state; during the change, the current I increased or decreased to become equal to a constant value.

If the determination at step S13 results in a "NO" answer, then the process directly goes to the end. In contrast, if the determination at step S13 results in a "YES" answer, then the process proceeds to step S14.

At step S14, the control apparatus 50 further determines, based on the values of the sensed current I acquired in the past, whether the current I of the rechargeable battery 10 was constant, immediately before the change, for a time period not shorter than a predetermined time Ta.

If the determination at step S14 results in a "NO" answer, then the process directly goes to the end. In contrast, if the determination at step S14 results in a "YES" answer, then the process proceeds to step S15.

That is, at steps S12-S14, the control apparatus 50 determines that the predetermined learning condition is satisfied if there has occurred a predetermined change in the current I of the rechargeable battery 10 from one stable state to another stable state (i.e., from I0 to I1 in FIG. 3).

In addition, in the present embodiment, the predetermined time Ta used in the determination at step S14 is set to be sufficiently longer than a larger one of the time constants $\tau 1$ and $\tau 2$ of the first and second reaction resistances (i.e., Ta≫$\tau 2$). Setting the predetermined time Ta as above, it is possible to ensure that the rechargeable battery 10 was in a steady state immediately before the change in the current I of the rechargeable battery 10.

At step S15, the control apparatus 50 calculates the learning values of the circuit constants of the equivalent circuit of the rechargeable battery 10.

Specifically, at this step, the control apparatus 50 first calculates the values of the voltage drop Vt(t) at the plurality of time points based on the values of the sensed terminal voltage V(t) acquired and stored in time series at step S11. Then, the control apparatus 50 determines Vs and V1 by substituting some of the values of the voltage drop Vt(t) into Equation (3), and calculates the learning values of the circuit constants Rs, R1 and C1 based on the determined Vs and V1. Moreover, the control apparatus 50 determines V2 by substituting the remaining values of the voltage drop Vt(t) into Equation (4), and calculates the learning values of the circuit constants R2 and C2 based on the determined V2.

After step S15, the process goes to the end.

Furthermore, in the present embodiment, the ohmic resistance component R2 of the second reaction resistance is corrected in view of the fact that the ohmic resistance component R2 changes according to the SOC (State of Charge) of the rechargeable battery 10. Hereinafter, a method of correcting the ohmic resistance component R2 according to the present embodiment will be described.

When the rechargeable battery 10 deteriorates over time, the ohmic resistance component R2 of the second reaction resistance increases according to the degree of deterioration of the rechargeable battery 10. Here, "resistance increase rate $\alpha$" is used to indicate the rate of increase of the ohmic resistance component R2. Specifically, the resistance increase rate $\alpha$ is calculated by the following equation: $\alpha$ (%)=((the current value of R2−the initial value of R2)/the initial value of R2)×100, where the initial value of R2 denotes the value of R2 in an unused state of the rechargeable battery 10.

Figure 4:
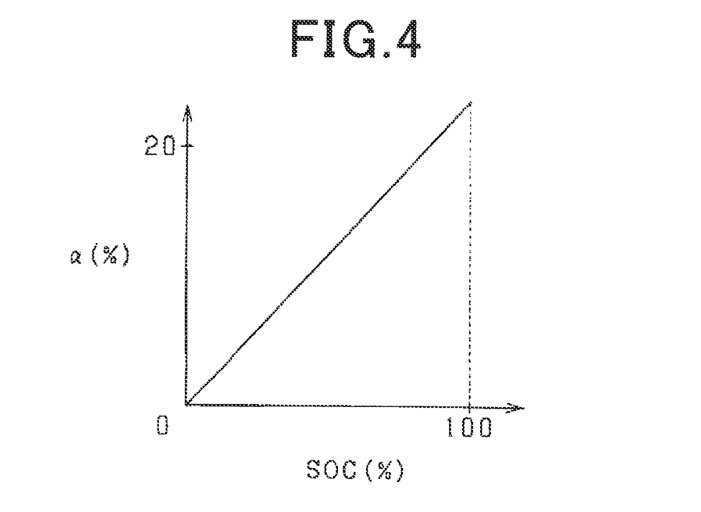
FIG. 4 is a graphical representation illustrating the relationship between resistance increase rate $\alpha$ and the SOC of the rechargeable battery.

FIG. 4 shows the relationship between the resistance increase rate $\alpha$ and the SOC of the rechargeable battery 10. It can be seen from FIG. 4 that when the SOC of the rechargeable battery 10 increases, the resistance increase rate $\alpha$ also increases in proportion to the SOC.

In view of the above fact, in the present embodiment, values of the SOC of the rechargeable battery 10 are stored in time series. Then, for each of the values of the SOC, the resistance increase rate $\alpha$ at the value of the SOC is calculated by the following equation: $\alpha$ (%)=((R2*b*−R2*a*)/R2*a*)×100, where R2 *a* is the initial value of the ohmic resistance component R2 at the value of the SOC, and R2 *b* is the learning value of the ohmic resistance component R2 at the value of the SOC. Thereafter, the slope $\beta$ of the resistance increase rate $\alpha$ with respect to the SOC of the rechargeable battery 10 is determined ($\beta=\alpha/SOC$).

Consequently, for each value of the SOC of the rechargeable battery 10, it is possible to first calculate the resistance increase rate $\alpha$ at the value of the SOC using the slope $\beta$ and then correct the learning value of the ohmic resistance component R2 at the value of the SOC using the calculated resistance increase rate $\alpha$.

According to the present embodiment, it is possible to achieve the flowing advantageous effects.

In the present embodiment, the control apparatus 50 functions as the battery characteristics learning apparatus to calculate the learning values of the circuit constants Rs, R1, C1, R2 and C2 of the equivalent circuit of the rechargeable battery 10. The circuit constant Rs (i.e., the DC resistance Rs) alone defines the time constant $\tau s$ which is equal to 0 s. The circuit constants R1 and C1 (i.e., the ohmic resistance component R1 and capacitance component C1 of the first reaction resistance) together define the time constant $\tau 1$ (i.e., $\tau 1$=R1·C1). The circuit constants R2 and C2 (i.e., the ohmic resistance component R2 and capacitance component C2 of the second reaction resistance) together define the time constant $\tau 2$ (i.e., $\tau 2$=R2·C2). The time constants $\tau s$, $\tau 1$ and $\tau 2$ are different from each other. The control apparatus 50 is configured to: acquire the values of the terminal voltage V of the rechargeable battery 10 sensed by the voltage sensor 40 and the values of the current I of the rechargeable battery 10 sensed by the current sensor 30; and store the acquired values of the terminal voltage V and current I in time series (see step S11 of FIG. 5). Further, the control apparatus 50 is configured to determine, based on the acquired values of the current I, whether there has occurred a predetermined change (i.e., from I0 to I1 in FIG. 3) in the current I flowing through the rechargeable battery 10 (see steps S12-S14 in FIG. 5). Furthermore, the control apparatus 50 is configured to calculate, when it is determined that the predetermined change has occurred, the learning values of the circuit constants Rs, R1, C1, R2 and C2 based on those values of the terminal voltage V and current I which are acquired during the first and second sampling periods (see step S15 in FIG. 5). The first sampling period is specified as the time period (0-t1) from the initial time point (t=0), at which the predetermined change in the current I starts, through the time point t1 which is distant from the initial time point by a length of time equal to the time constant $\tau 1$. That is, the first sampling period is set so as to include the time point t1. The second sampling period is specified as the time period (t3-t4) around the time point t2 which is distant from the initial time point (t=0) by a length of time equal to $\tau 2$. That is, the second sampling period is set so as to include the time point t2.

With the above configuration, it is possible to reliably determine, based on the values of the current I acquired and stored in time series, whether there has occurred the predetermined change in the current I which is suitable for calculation of the learning values of the circuit constants Rs, R1, C1, R2 and C2. Further, when the predetermined change has occurred, it is possible to accurately calculate the learning values of the circuit constants Rs, R1, C1, R2 and C2 based on those values of the terminal voltage V and current I which are acquired during the first and second sampling periods; the first and second sampling periods are specified respectively according to the time constants $\tau 1$ and $\tau 2$. That is, for each of the circuit constants Rs, R1, C1, R2 and C2, it is possible to accurately calculate the learning value of the circuit constant based on those values of the terminal voltage V and current I which are suitable for the circuit constant.

Moreover, in the present embodiment, the control apparatus 50 determines that the predetermined change has occurred in the current I flowing through the rechargeable battery 10 when the current I has increased from I0 to I1 after being kept at the constant value I0 for a time period not shorter than the predetermined time Ta (see step S14 of FIG. 5).

With the above configuration, it is possible to ensure that the rechargeable battery 10 was in a steady state immediately before the increase of the current I from I0 to I1 (or before the initial time point t=0). Consequently, it is possible to suppress the influence of polarization occurring in the rechargeable battery 10 at the initial time point (t=0), thereby making it possible to more accurately calculate the learning values of the circuit constants Rs, R1, C1, R2 and C2.

Furthermore, in the present embodiment, the control apparatus 50 determines that the predetermined change has occurred in the current I flowing through the rechargeable battery 10 when the rechargeable battery 10 is brought into the steady state after the increase of the current I from I0 to I1 (see step S12 of FIG. 5). More specifically, with the increase of the current I from I0 to I1, there occurs the voltage drop Vt across the internal resistance 11 of the rechargeable battery 10. Further, after a time sufficiently longer than a larger one of the time constants $\tau 1$ and $\tau 2$ has elapsed (i.e., t»$\tau 2$), the reachable battery 10 is brought into the steady state where both the current I flowing through the rechargeable battery 10 and the terminal voltage V of the rechargeable battery 10 are constant (see FIG. 3).

With the above configuration, the control apparatus 50 performs the calculation of the learning values of the circuit constants Rs, R1, C1, R2 and C2 only after the rechargeable battery 10 is brought into the steady state. Therefore, all the values of the terminal voltage V of the rechargeable battery 10 necessary for the calculation of the learning values of the circuit constants can be acquired before the calculation of the learning values starts. Consequently, it is possible to more reliably and accurately calculate the learning values of the circuit constants.

In the present embodiment, the first sampling period (0-t1) is used both as the sampling period for acquiring those values of the terminal voltage V and current I which are necessary for calculation of the learning value of the circuit constant Rs and as the sampling period for acquiring those values of the terminal voltage V and current I which are necessary for calculation of the learning values of the circuit constants R1 and C1.

With the above configuration, it is possible to simplify the process of the control apparatus 50 for calculating all the learning values of the circuit constants of the equivalent circuit of the rechargeable battery 10.

In the present embodiment, the control apparatus 50 calculates the SOC of the rechargeable battery 10 in the second sampling period during which those values of the terminal voltage V and current I used for the calculation of the circuit constant R2 (i.e., the ohmic resistance component R2 of the second reaction resistance) are acquired. Then, the control apparatus 50 corrects the learning value of the circuit constant R2 according to the calculated SOC. More specifically, the control apparatus 50 first calculates the resistance increase rate a at the calculated SOC using the predetermined slope $\beta$ (i.e., $\alpha=\beta \cdot SOC$) and then corrects the learning value of the circuit constant R2 using the calculated resistance increase rate $\alpha$.

With the above configuration, it is possible to more accurately calculate the learning value of the circuit constant R2.

[Second Embodiment]

The values of the first and second reaction resistances during charge of the rechargeable battery 10 are different from those during discharge of the rechargeable battery 10.

In view of the above fact, in the present embodiment, the learning values of the circuit constants of the equivalent circuit during charge of the rechargeable battery 10 are calculated separately from those during discharge of the rechargeable battery 10.

Figure 6:
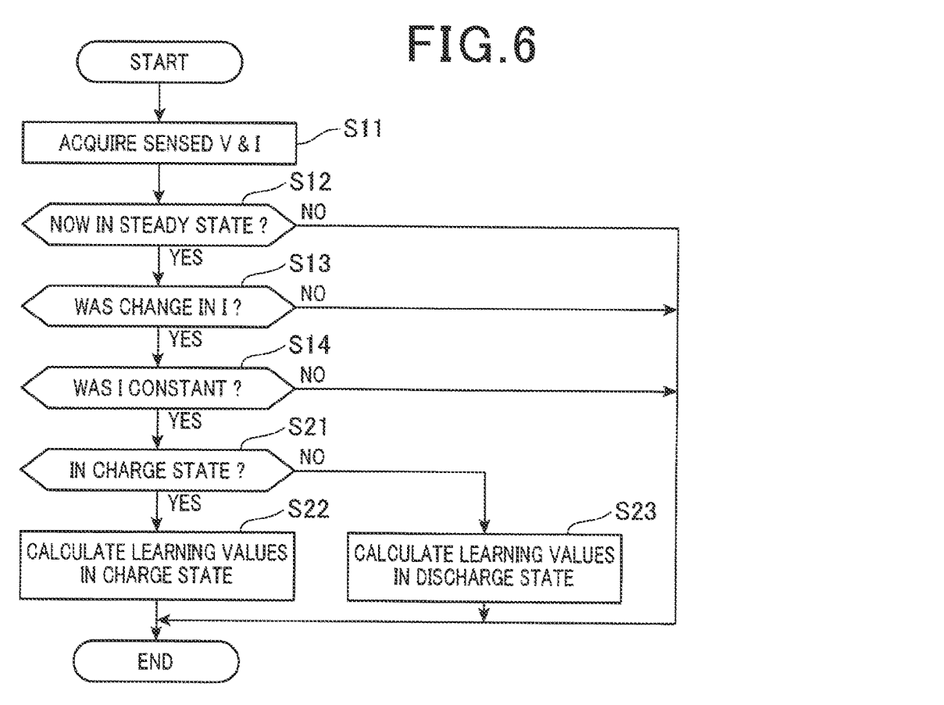
FIG. 6 is a flow chart illustrating a process, according to a second embodiment, of the battery characteristics learning apparatus for calculating the learning values of the circuit constants.

FIG. 6 shows a process of calculating the learning values of the circuit constants according to the present embodiment. This process is repeatedly performed by the control apparatus 50 in a predetermined cycle.

It should be first noted that steps S11-S14 in FIG. 6 are respectively the same as those in FIG. 5 described in the first embodiment. Therefore, description of steps S11-S14 is not repeated hereinafter.

Referring to FIG. 6, in the present embodiment, at step S21, the control apparatus 50 determines, based on the values of the sensed current I of the rechargeable battery 10 acquired and stored in time series at step S11, whether the rechargeable battery 10 is currently in a charge state or in a discharge state.

If the rechargeable battery 10 is determined as being in a charge state (S21: YES), the process proceeds to step S22, at which the control apparatus 50 calculates the learning values of the circuit constants of the equivalent circuit in the charge state. Then, the process goes to the end.

In contrast, if the rechargeable battery 10 is determined as being in a discharge state (S21: NO), the process proceeds to step S23, at which the control apparatus 50 calculates the learning values of the circuit constants of the equivalent circuit in the discharge state. Then, the process goes to the end.

With the above process, it is possible to more accurately calculate the learning values of the circuit constants of the equivalent circuit according to the operating condition of the rechargeable battery 10.

[Third Embodiment]

In the first embodiment, as described previously, the control apparatus 50 performs the calculation of the learning values of the circuit constants when the rechargeable battery 10 is brought into a steady state after the increase of the current I flowing through the rechargeable battery 10 from I0 to I1; in the steady state, both the current I flowing through the rechargeable battery 10 and the terminal voltage V of the rechargeable battery 10 are constant.

In comparison, in the present embodiment, the control apparatus 50 performs the calculation of the learning values of the circuit constants before the rechargeable battery 10 is brought into the steady state.

Figure 7:
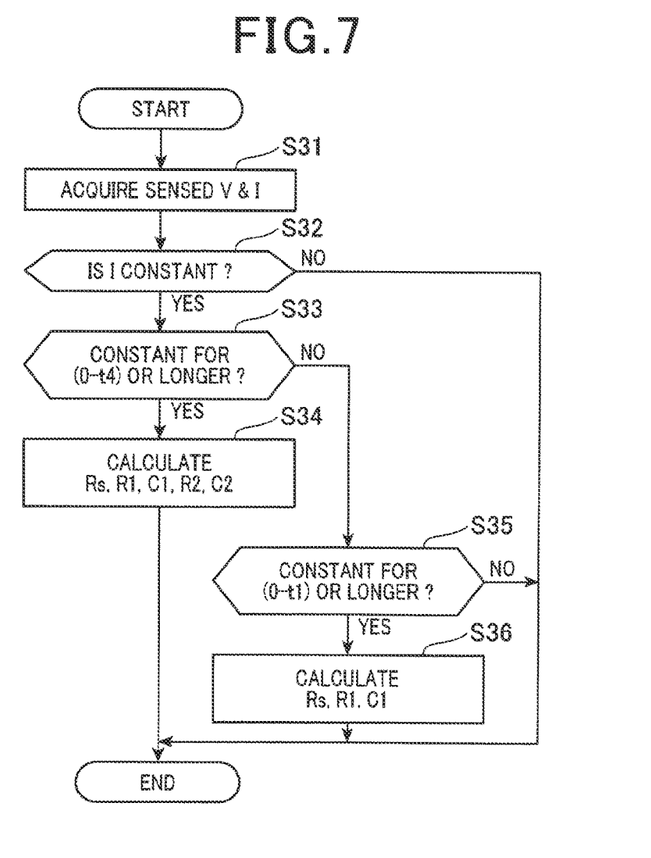
FIG. 7 is a flow chart illustrating a process, according to a third embodiment, of the battery characteristics learning apparatus for calculating the learning values of the circuit constants.

FIG. 7 shows a process of calculating the learning values of the circuit constants according to the present embodiment. This process is repeatedly performed by the control apparatus 50 in a predetermined cycle.

First, at step S31, the control apparatus 50 acquires values of the terminal voltage V of the rechargeable battery 10 sensed by the voltage sensor 40 and values of the current I of the rechargeable battery 10 sensed by the current sensor 30. Then, the control apparatus 50 stores the acquired values of the sensed terminal voltage V and current I in time series.

At step S32, the control apparatus 50 determines, based on the values of the sensed current I acquired and stored in time series at step S31, whether the current I currently flowing through the rechargeable battery 10 is constant.

If the determination at step S32 results in a "NO" answer, then the process directly goes to the end. In contrast, if the determination at step S32 results in a "YES" answer, then the process proceeds to step S33.

At step S33, the control apparatus 50 further determines, based on the values of the sensed current I acquired and stored in time series at step S31, whether the current I flowing through the rechargeable battery 10 has been constant for a time period not shorter than the time period (0-t4) shown in FIG. 3.

If the determination at step S33 results in a "YES" answer, then the process proceeds to step S34.

At step S34, the control apparatus 50 first calculates the learning values of the circuit constants Rs, R1 and C1 based on the values of the sensed terminal voltage V acquired during the first sampling period (0-t1). Then, the control apparatus 50 further calculates the learning values of the circuit constants R2 and C2 based on the values of the sensed terminal voltage V acquired during the second sampling period (t3-t4). Thereafter, the process goes to the end.

On the other hand, if the determination at step S33 results in a "NO" answer, then the process proceeds to step S35.

At step S35, the control apparatus 50 further determines, based on the values of the sensed current I acquired and stored in time series at step S31, whether the current I flowing through the rechargeable battery 10 has been constant for a time period not shorter than the first sampling period (0-t1) shown in FIG. 3.

If the determination at step S35 results in a "NO" answer, then the process directly goes to the end. In contrast, if the determination at step S35 results in a "YES" answer, then the process proceeds to step S36.

At step S36, the control apparatus 50 calculates the learning values of the circuit constants Rs, R1 and C1 based on the values of the sensed terminal voltage V acquired during the first sampling period (0-t1). Thereafter, the process goes to the end.

With the above process according to the present embodiment, it is possible to secure more chances for the control apparatus 50 to calculate the learning values of the circuit constants.

[Fourth Embodiment]

In the first embodiment, the learning values of the circuit constants are calculated based on the values of the sensed terminal voltage V of the rechargeable battery 10 acquired during the first sampling period (0-t1) and the second sampling period (t3-t4).

In comparison, in the present embodiment, referring again to FIG. 3, the learning values of the circuit constants are calculated based on the values of the sensed terminal voltage V acquired at first to third sampling time points. The first sampling time point is set to the initial time point (t=0). In other words, the first sampling time point is set to a time point which is distant from the initial time point by a length of time equal to TS; TS is the time constant of the DC resistance Rs and equal to 0. The second sampling time point is set to the time point t1 which is distant from the initial time point (t=0) by a length of time equal to $\tau 1$; $\tau 1$ is the time constant of the first reaction resistance and equal to R1·C1. The third sampling time point is set to the time point t2 which is distant from the initial time point (t=0) by a length of time equal to $\tau 2$; $\tau 2$ is the time constant of the second reaction resistance and equal to R2·C2.

Specifically, in the present embodiment, the voltage drop Vt(t) across the internal resistance 11 of the rechargeable battery 10 at each of the first to the third sampling time points is first calculated based on the value of the terminal voltage V(t) acquired at the sampling time point (i.e., Vt(t)=V(t)−V0a). Then, the voltage drop Vs caused by the DC resistance Rs is determined by the following equation: Vs=Vt(0). The voltage drop V1 caused by the first reaction resistance in a steady state is calculated by the following equation which is derived from Equation (3): V1=(Vt(t)−Vs)/(1−exp(−t/$\tau 1$)). The voltage drop V2 caused by the second reaction resistance in a steady state is calculated by the following equation which is derived from Equation (4): V2=(Vt(t)−(Vs +V1))/(1−exp(−t/$\tau 2$)). Thereafter, the learning values of the circuit constants Rs, R1, C1, R2, C2 are calculated based on the above-calculated Vs, V1 and V2.

While the above particular embodiments have been shown and described, it will be understood by those skilled in the art that various modifications, changes, and improvements may be made without departing from the spirit of the present invention.

(1) For example, in the first embodiment, the internal resistance 11 of the rechargeable battery 10 is represented by a model which includes the three groups of the circuit constants (i.e., the DC resistance Rs, the first reaction resistance (R1, C1) and the second reaction resistance (R2, C2)). The three groups of the circuit constants respectively define three time constants $\tau s$, $\tau 1$ and $\tau 2$ that are different from each other.

However, the internal resistance 11 of the rechargeable battery 10 may also be represented by a model which includes two, four or more groups of circuit constants; the groups of the circuit constants define at least two time constants different from each other. For example, the internal resistance 11 may be represented by a model which includes only first and second reaction resistances; the first and second reaction resistances respectively define first and second time instants that are different from each other.

(2) In the first embodiment, the control apparatus 50 is configured to perform the calculation of the learning values of the circuit constants on condition that the current I flowing through the rechargeable battery 10 was constant, immediately before the change (i.e., the increase from I0 to I1), for a time period not shorter than the predetermined time Ta.

However, the control apparatus 50 may also be configured to perform the calculation of the learning values of the circuit constants without satisfying the above condition. In other words, the control apparatus 50 may be configured to perform the calculation of the learning values of the circuit constants even when the rechargeable battery 10 was not in a steady state immediately before the change.

(3) In the first embodiment, the ohmic resistance component R2 of the second reaction resistance is corrected according to the SOC of the rechargeable battery 10.

However, it is also possible to correct the ohmic resistance component R2 of the second reaction resistance according to the temperature (instead of the SOC) of the rechargeable battery 10. Specifically, in this case, a temperature sensor may be mounted to the rechargeable battery 10 to sense the temperature of the rechargeable battery 10. Then, the relationship between the resistance increase rate α and the temperature of the rechargeable battery 10 may be determined based on the learning values of the ohmic resistance component R2 of the second reaction resistance obtained at different values of the temperature of the rechargeable battery 10. Consequently, for each value of the temperature of the rechargeable battery 10, it would be possible to first calculate the resistance increase rate α at the value of the temperature based on the above-determined relationship and then correct the learning value of the ohmic resistance component R2 at the value of the temperature using the calculated resistance increase rate α.

Moreover, it is also possible to correct the ohmic resistance component R2 of the second reaction resistance according to the current I flowing through the rechargeable battery 10 (instead of the SOC and temperature of the rechargeable battery 10). Specifically, in this case, the relationship between the resistance increase rate α and the current I flowing through the rechargeable battery 10 may be first determined based on the learning values of the ohmic resistance component R2 of the second reaction resistance obtained at different values of the current I sensed by the current sensor 30. Consequently, for each value of the current I, it would be possible to first calculate the resistance increase rate α at the value of the current I based on the above-determined relationship and then correct the learning value of the ohmic resistance component R2 at the value of the current I using the calculated resistance increase rate α.

Furthermore, it is also possible to correct the ohmic resistance component R2 of the second reaction resistance according to at least two of the SOC of the rechargeable battery 10, the temperature of the rechargeable battery 10 and the current I flowing through the rechargeable battery 10.

(4) In the first embodiment, the rechargeable battery 10 is implemented by a lithium-ion battery. However, the rechargeable battery 10 may also be implemented by other rechargeable batteries, such as a lead-acid battery or a nickel-hydrogen battery.

(5) In the first embodiment, the control apparatus 50 performs the various functions by executing steps S11-S15 of the process shown in FIG. 5. In other words, means for performing the various functions are implemented by software. However, at least one of those means may be implemented by hardware, such as a dedicated electrical circuit.

What is claimed is:

1. A system comprising:
 a voltage sensor configured to sense a terminal voltage of a rechargeable battery;
 a current sensor configured to sense a current flowing through the rechargeable battery; and
 a control apparatus for calculating learning values of a plurality of circuit constants of an equivalent circuit of the rechargeable battery, the plurality of circuit constants defining a plurality of time constants that are different from each other, the control apparatus at least being configured to:
 acquire values of terminal voltage of the rechargeable battery which is sensed by the voltage sensor and values of current flowing through the rechargeable battery which is sensed by current sensor and store the acquired values of the terminal voltage and the current in time series;
 determine, based on the acquired values of the current whether there has occurred a predetermined change in the current flowing through the rechargeable battery;
 calculate, when it is determined that the predetermined change has occurred, the learning values of the circuit constants based on those values of the terminal voltage and the current which are acquired at a plurality of sampling time points or during a plurality of sampling periods, each of the sampling time points being set to a time point that is distant from an initial time point, at which the predetermined change in the current starts, by a length of time equal to a corresponding one of the time constants, each of the sampling periods being set so as to include a time point that is distant from the initial time point by a length of time equal to a corresponding one of the time constants.

2. The system as set forth in claim 1, wherein the control apparatus is further configured to determine that the predetermined change has occurred in the current flowing through the rechargeable battery when the current has increased or decreased after being kept at a constant value for a time period not shorter than a predetermined time.

3. The system as set forth in claim 2, wherein the control apparatus is further configured to determine that the predetermined change has occurred in the current flowing through the rechargeable battery when the rechargeable battery is brought into a steady state after the increase or decrease of the current,
 in the steady state, both the current flowing through the rechargeable battery and the terminal voltage of the rechargeable battery being constant.

4. The system as set forth in claim 1, wherein the control apparatus is further configured to determine whether the rechargeable battery is in a charge state or in a discharge state based on the values of the current sensor, wherein
 when the rechargeable battery is determined as being in the charge state, the control apparatus calculates the learning values of the circuit constants in the charge state, and
 when the rechargeable battery is determined as being in the discharge state, the control apparatus calculates the learning values of the circuit constants in the discharge state.

5. The system as set forth in claim 1, wherein the control apparatus is further configured to:
 calculate SOC (State of Charge) of the rechargeable battery; and
 correct at least one of the calculated learning values of the circuit constants according to the SOC of the rechargeable battery at the sampling time point or in the sampling period where the values of the terminal voltage and the current used for the calculation of the at least one of the learning values are acquired.

6. A method comprising:
 sensing, using a voltage sensor, a terminal voltage of a rechargeable battery;

sensing, using a current sensor, a current flowing through the rechargeable battery; and calculating, using a computer, learning values of a plurality of circuit constants of an equivalent circuit of the rechargeable battery, the plurality of circuit constants defining a plurality of time constants that are different from each other, said calculating comprising:

acquiring values of terminal voltage of the rechargeable battery which is sensed by the voltage sensor and values of current flowing through the rechargeable battery which is sensed by current sensor and storing the acquired values of the terminal voltage and the current in time series;

determining, based on the acquired values of the current whether there has occurred a predetermined change in the current flowing through the rechargeable battery;

calculating, when it is determined that the predetermined change has occurred, the learning values of the circuit constants based on those values of the terminal voltage and the current which are acquired at a plurality of sampling time points or during a plurality of sampling periods, each of the sampling time points being set to a time point that is distant from an initial time point, at which the predetermined change in the current starts, by a length of time equal to a corresponding one of the time constants, each of the sampling periods being set so as to include a time point that is distant from the initial time point by a length of time equal to a corresponding one of the time constants.

7. The method as set forth in claim 6, further comprising:
determining that the predetermined change has occurred in the current flowing through the rechargeable battery when the current has increased or decreased after being kept at a constant value for a time period not shorter than a predetermined time.

8. The method as set forth in claim 7, further comprising:
determining that the predetermined change has occurred in the current flowing through the rechargeable battery when the rechargeable battery is brought into a steady state after the increase or decrease of the current, in the steady state, both the current flowing through the rechargeable battery and the terminal voltage of the rechargeable battery being constant.

9. The method as set forth in claim 6, further comprising:
determining whether the rechargeable battery is in a charge state or in a discharge state based on the values of the current sensor, wherein when the rechargeable battery is determined as being in the charge state, the control apparatus calculates the learning values of the circuit constants in the charge state, and when the rechargeable battery is determined as being in the discharge state, the control apparatus calculates the learning values of the circuit constants in the discharge state.

10. The method as set forth in claim 6, wherein further comprising:

calculating SOC (State of Charge) of the rechargeable battery; and     correcting at least one of the calculated learning values of the circuit constants, according to the SOC of the rechargeable battery at the sampling time point or in the sampling period where the values of the terminal voltage and the current used for the calculation of the at least one of the learning values are acquired.

\* \* \* \* \*